United States Patent [19]

Tokumaru et al.

[11] 4,260,906
[45] Apr. 7, 1981

[54] SEMICONDUCTOR DEVICE AND LOGIC CIRCUIT CONSTITUTED BY THE SEMICONDUCTOR DEVICE

[75] Inventors: Yukuya Tokumaru; Masanori Nakai, both of Yokohama, Japan

[73] Assignee: Tokyo Shibaura Electric Co., Ltd., Japan

[21] Appl. No.: 906,021

[22] Filed: May 15, 1978

Related U.S. Application Data

[63] Continuation-in-part of Ser. No. 709,600, Jul. 29, 1976, abandoned.

[30] Foreign Application Priority Data

| Jul. 31, 1975 | [JP] | Japan | 50-93759 |
| Jul. 31, 1975 | [JP] | Japan | 50-93760 |
| Jul. 31, 1975 | [JP] | Japan | 50-93761 |
| Jul. 31, 1975 | [JP] | Japan | 50-93763 |
| Aug. 6, 1975 | [JP] | Japan | 50-95637 |
| Aug. 8, 1975 | [JP] | Japan | 50-96478 |

[51] Int. Cl.$^3$ .............. H03K 19/091; H01L 27/04
[52] U.S. Cl. ............................. 307/477; 357/15; 357/44; 357/46; 357/86; 357/89; 357/92
[58] Field of Search .......... 357/92, 44, 46, 89; 307/213

[56] References Cited

U.S. PATENT DOCUMENTS

| 3,427,511 | 2/1969 | Rosenzweig | 357/89 |
| 3,667,006 | 5/1972 | Ruegg | 357/89 |
| 3,922,565 | 11/1975 | Berger et al. | 357/92 |
| 3,969,747 | 7/1976 | Tsuyuki et al. | 357/46 |

FOREIGN PATENT DOCUMENTS 2634304  2/1977  Fed. Rep. of Germany ............ 357/92

OTHER PUBLICATIONS

Berger et al., IEEE International Solid-State Circuits Conf., Feb. 1975, Digest of Technical Papers, pp. 172-173.
Peltier, IEEE ISSCC, Feb. 1975, Dig. Tech. Papers, pp. 168-169.

*Primary Examiner*—William D. Larkins
*Attorney, Agent, or Firm*—Finnegan, Henderson, Farabow, Garrett & Dunner

[57] ABSTRACT

A semiconductor device comprises a P type semiconductor substrate; an N type layer buried in the P type substrate; and an N type isolating region extending from the surface of the P type substrate to the N type buried region to provide a P type isolated region in the P type substrate. In the P type isolated region marked off by the N type isolating region is formed a first N type region so as not to contact the N type isolating region and buried region and a P type second region is diffused in the first N type region. A logic circuit is constituted by a first vertical PNP transistor formed of the P type second region, first N type region and P type isolated region and a second vertical NPN transistor formed of the first N type region, P type isolated region and N type buried region.

8 Claims, 27 Drawing Figures

SEMICONDUCTOR DEVICE AND LOGIC CIRCUIT CONSTITUTED BY THE SEMICONDUCTOR DEVICE

CROSS-REFERENCE TO RELATED APPLICATION

This is a continuation-in-part application of U.S. Pat. Application Ser. No. 709,600 filed July 29, 1976 now abandoned.

This invention relates to a semiconductor device wherein two transistors of different polarity constitute a logic circuit.

In recent years, attention is drawn to a logic circuit device which is of different type from the conventional logic circuit devices such as the diode transistor logic (DTL) circuit, transistor transistor logic (TTL) circuit and current mode logic (CML) circuit, has a simpler arrangement, is manufactured with a higher yield, admits of a denser integration, and consumes a smaller amount of power than the above-mentioned prior art logic circuit devices. The above-mentioned newly devised logic circuit device has a vertical transistor formed in a semiconductor substrate to act as an inverter element and a lateral transistor for introducing a minority carrier into the base region of the vertical transistor. A collector output from the inverter transistor is controlled by regulating an input level with the minority carrier injected into the base region of the inverter transistor. With the newly devised logic circuit device, an N type epitaxial layer is laminated on an N type semiconductor substrate at a lower concentration of impurity than in said substrate. Boron is selectively diffused in the epitaxial layer at the rate of about $10^{17}$ to $10^{19}$ atoms/cm$^3$ to form first and second P type regions. Phosphorus is diffused in the first P type region at the rate of $10^{18}$ to $10^{21}$ atoms/cm$^3$ to form an N type region. The impurity concentration in the epitaxial layer is chosen to be lower than in the P type regions.

The above-mentioned semiconductor device comprises a lateral PNP transistor whose emitter, base and collectors are constituted by the second P type region, epitaxial layer and first P type region respectively, and a vertical NPN transistor whose emitter, base and collector are formed of the epitaxial layer, first P type region and N type region respectively.

Where forward voltage is impressed on the PN junction defined by the second P type region and N type epitaxial layer, then holes flow into the first P type region from the second P type region through the epitaxial layer. Where, at this time, the base (first P type region) of the vertical transistor constituting the input region of the logic circuit element is supplied with a "1" level input signal, then emitter current $I_{EP}$ supplied from the emitter region (second P type region) of the grounded base lateral transistor multiplies the current amplification factor of said transistor by $\alpha_{PNP}$ times (namely, $I_{EP} \times \alpha_{PNP}$). The emitter current $I_{EP}$ flows into the first P type region constituting the collector of the lateral transistor and the base region of the vertical transistor, rendering the vertical transistor conductive and causing the output region of the logic element, namely, the collector region (N type region) of the vertical transistor to have a "0" level. The current of the collector region is brought to a level arrived at by multiplying the base current of the vertical NPN transistor by the current amplification factor $\beta_{NPN}$ of said NPN transistor.

Where the base region of the vertical transistor is supplied with a "0" level signal instead of the aforesaid input signal having a "1" level, the emitter current flows out of the input region, but does not form the base current of the vertical NPN transistor. As the result, the vertical transistor becomes nonconductive, causing the output region, or collector region to have a "1" level.

A plurality of logic circuit elements collectively having an inverter characteristic in which input and output signals are inverted in the logic level, as mentioned above, are combined to constitute a basic logic circuit such as NAND, NOR or flip-flop.

Power consumption of the logic element is largely affected by the property of the lateral PNP transistor, namely, the current amplification factor $\alpha_{PNP}$ of the grounded base transistor. The closer to 1 the value of $\alpha_{PNP}$, the less power comsumption. The maximum operating speed, frequency characteristic, fun out, noise margin, etc. of the inverter element (vertical transistor) are affected by the properties of the vertical NPN transistor particularly the current amplification factor $\beta_{NPN}$ and the gain-bandwidth product $f_T$ of the vertical NPN transistor. For the logic element, therefore, it is necessary to elevate the current amplification factor of the lateral PNP transistor and vertical NPN transistor and the gain-bandwidth product of the vertical NPN transistor at the same time.

A current amplification factor of a transistor is generally affected by the efficiency with which minority carriers are injected and transferred. The minority carrier-injection efficiency denotes the rate at which the minority carriers are brought from the emitter region into the base region of a transistor per unit input current. With Ie taken to denote the emitter current and Iep that component of said emitter current which flows into the base region, the minority carrier-injection efficiency may be expressed by the following formula:

$$\gamma = (\partial Iep/\partial Ie)$$

$$Vc = \text{constant}$$

For improvement of the minority carrier-injection efficiency, therefore, it is advised to cause the impurity concentration of the emitter region to bear a proper ratio to that of the base region, provide a suitable gradient of impurity concentration in the emitter-base junction in order to increase a density of minority carriers taken into the base region and also apply a forward-acting acceleration electric field to the minority carriers. With Lb taken to denote a distance through which the minority carriers are diffused in the base region, and W the width of the base region, the efficiency $\beta$ of transferring the minority carrier through the base region may be expressed by the following formula:

$$\beta = \text{sech}(W/Lb)$$

For improvement of the minority carrier-transfer efficiency $\beta$, therefore, it is necessary to shorten, as much as possible, an effective distance through which the minority carriers injected into the base region from the emitter region are further transferred through the base region to the collector region, namely, the width of the base region, and form the base region so as to prevent the minority carriers from being caught in the recombination centers of the base region. It is relatively easy to let the impurity concentration of the lateral PNP transistor of the prior art logic element bear a proper ratio to the impurity concentration of the base region of the lateral PNP transistor and decrease the density of the recombination centers of the base region. Where, however, it is tried to form the base region with a small width for improvement of the minority carrier-transfer efficiency, then the base width is greatly restricted in photoetching, particularly by the limit precision with which a photomask is now produced. At present, the base width is defined within the range of 5 to 10 microns. Moreover, the emitter and base regions are diffused in an N type epitaxial layer so as to face each other. A space between the mutually facing diffused sides of both regions is progressively broadened in a depth direction. In other words, a base region formed between the emitter and collector has a progressively large width in the depth direction prominently decreasing the efficiency of transferring the minority carrier through the base. Since the emitter and collector regions are diffused with a space therebetween progressively spread out in the depth direction, then impurity concentration in the junction of the emitter region and the collector region collectively present a gentle gradient, decreasing the efficiency of injecting the minority carriers into the base region. For this reason, great difficulties have hitherto been experienced in forming a logic element so as to enable the lateral PNP transistor to have a high current amplification factor.

With the vertical NPN transistor, the emitter is formed of an N type epitaxial layer, and the base and collector are constituted by regions formed in the emitter region by double diffusion. Though, with the vertical NPN transistor, it is relatively easy to shorten the width of the base region, the impurity concentration of the emitter region has to be decreased from that of the base region from the standpoint of manufacturing a transistor. Moreover, the minority carriers taken into the base region are subjected to a deceleration electric field resulting from the gradient of the impurity concentration of the base region, and are consequently retarded in passage into the base region. As the result, the so-called backward-acting transistor whose emitter is formed of an N type epitaxial layer has a very low current amplification factor.

Moreover, with the prior art logic element, some of the regions constituting the lateral PNP transistor and vertical NPN transistor are joined together. Therefore, even when it is tried to set a ratio between the impurity concentrations of the regions of one of the lateral and vertical transistors at such a level as to elevate the current amplification factor, the current amplification factor of the other transistor eventually falls. Further, where improvement of the efficiency of injecting the minority carriers into the base region of the lateral PNP transistor is attempted by decreasing the impurity concentration of the base region or N type epitaxial layer, then the efficiency of injecting the minority carriers into the base region of the vertical NPN transistor noticeably falls, because the N type epitaxial layer is concurrently used as the emitter region of the vertical NPN transistor. The gain-bandwidth ratio $f_T$ of the vertical NPN transistor indicates a small value, because, as previously described, the vertical NPN transistor has a low current amplification factor and an emitter time constant has a large value due to the emitter region wholly formed of the N type epitaxial layer.

The above-mentioned drawbacks accompanying the prior art logic element restrict the extent of decreasing the power consumption of the logic element and accelerating its operation and substantially prevent the logic element from acting particularly where a signal used has a high frequency. Further, the speed at which an output level is inverted, namely the speed at which the output is shifted from the logic "0" level to the logic "1" level is largely affected by excess minority carriers stored in the base and collector regions of the vertical NPN transistor. Namely, where the output from the logic element has a logic level of "0", then the vertical NPN transistor is fully turned on, causing the emitter-base junction and base-collector junction of the transistor to be biased forward and also the excess minority carriers to be stored in the base and collector regions. Where, under this condition, it is attempted to supply a "0" level signal to the input terminal of the logic element in order to produce an output of "1" level, then the excess minority carriers stored in the base and collector regions of the vertical NPN transistor flow therethrough, preventing an output from being immediately shifted to the "1" level. Therefore, the customary practice of decreasing the excess minority carriers stored in the respective regions of a transistor to improve the switching characteristic of the transistor is to diffuse gold in the respective regions or apply a metal-semiconductor junction diode having a rectifying property. With the prior art logic element, however, the above-mentioned process gives rise to a decline in the current amplification factor $\alpha_{PNP}$ of the grounded base lateral PNP transistor and the current amplification factor $\beta_{NPN}$ of the grounded emitter vertical NPN transistor. Moreover, formation on the logic element of a metal-semiconductor junction diode presenting a rectifying property is difficult to carry out, if consideration is given to the impurity concentration in the surface of the respective active regions of the transistor.

It is according an object of this invention to provide a semiconductor device wherein improvement is made in the current amplification factors of transistors constituting a logic element, thereby decreasing power consumption.

Another object of the invention is to provide a semiconductor device, wherein improvement is made on the current amplification factors of transistors constituting a logic element, thereby preventing current hogging to attain the high speed and high frequency operation of the semiconductor device.

Still another object of the invention is to provide a semiconductor device, wherein excess minority carriers stored in a transistor used as an inverter element with a logic element is restricted, thereby accelerating the speed at which an output from the logic element is switched from a level of "0" to that of "1".

According to an aspect of this invention, there is provided a semiconductor device, wherein at least one region of one conductivity type is buried in a semiconductor substrate of the opposite conductivity type; there is formed in the semiconductor substrate a one conductivity type isolating region extending from the surface of the semiconductor substrate to the buried region and providing an isolated region of the opposite conductivity type; a first region is formed in the opposite conductivity type isolated region with the same conductivity type as the isolating region so as not to contact the buried region and isolating region; and a second region is formed in the first region with the opposite conductivity type thereto. Namely, a logic element according to this invention comprises a first vertical from transistor whose emitter, base and collector are constituted by the second region, first region and isolated region respectively, and a second vertical transistor whose emitter, base and collector are constituted by the first region, isolated region and buried region respectively.

This invention can be more fully understood from the following detailed description when taken in conjunction with the accompanying drawings, in which.

Figure 1:
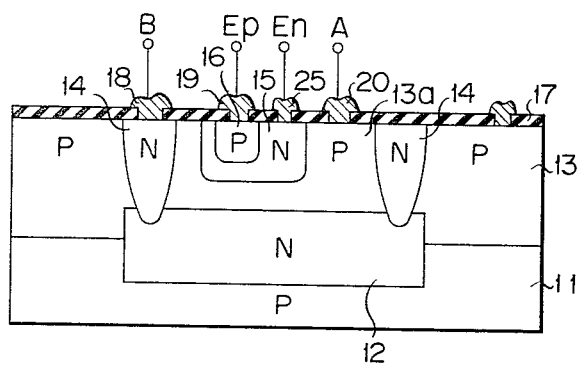
FIG. 1 is a cross sectional view of a semiconductor device according to an embodiment of this invention.
Figure 4:
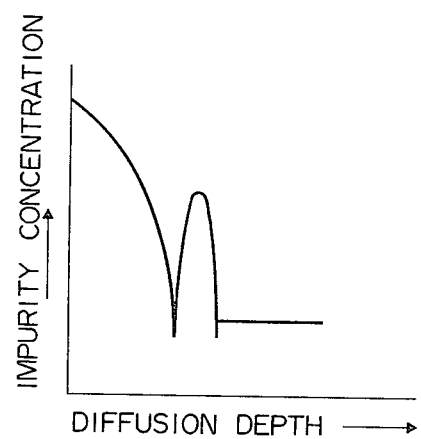
Figure 2:
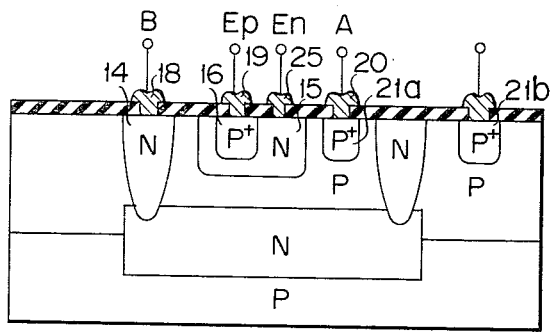
FIG. 2 is a cross sectional view of the semiconductor device of FIG. 1 which is provided with an ohmic contact region.
Figure 5:
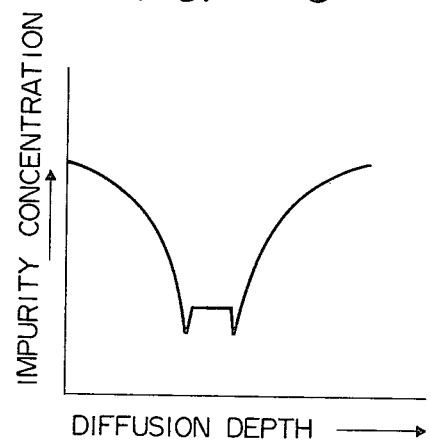
Figure 3:
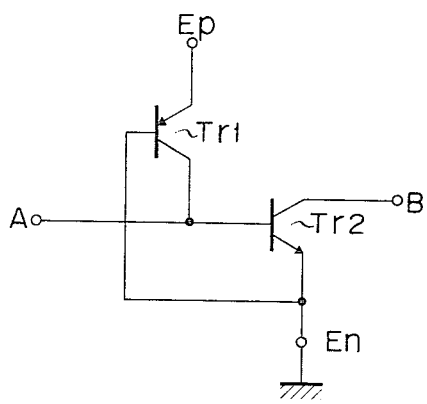
Figure 6:
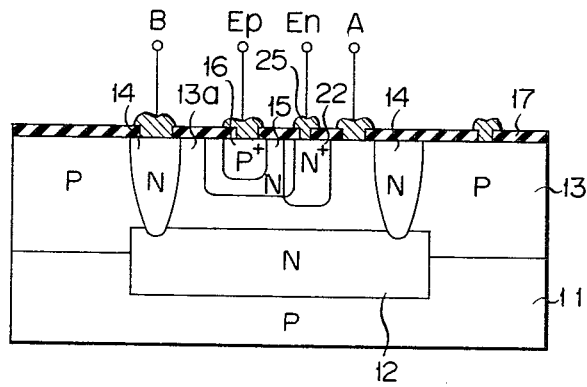
Figure 7:
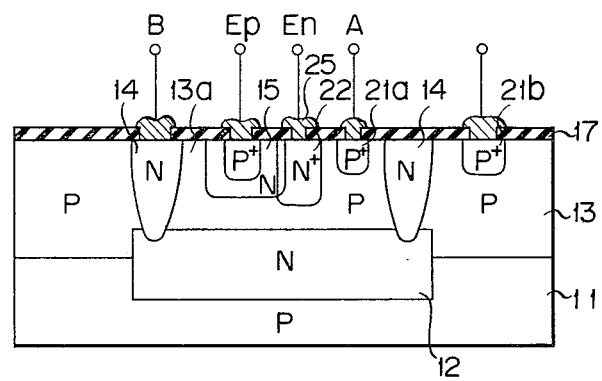
Figure 8:
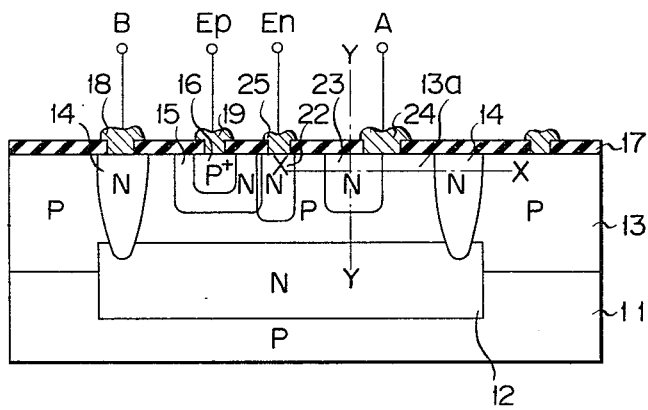
Figure 9:
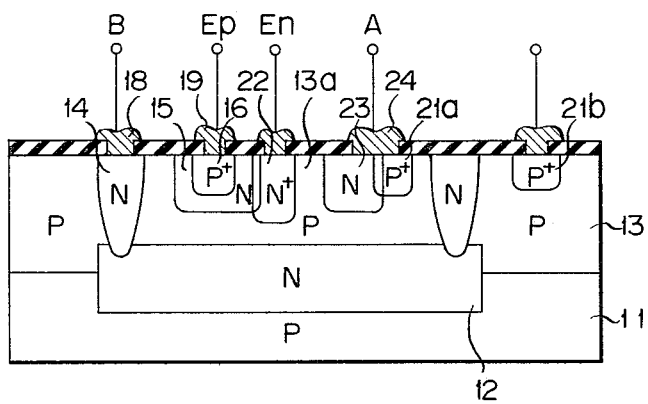
Figure 10:
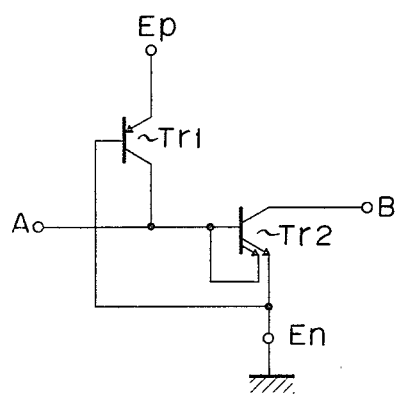
Figure 11A:
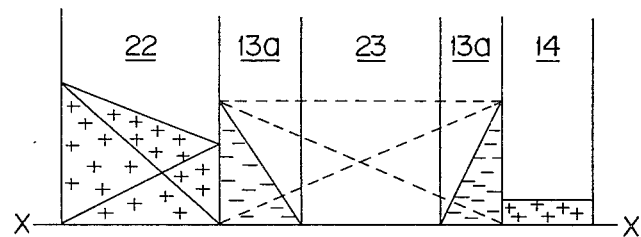
Figure 11B:
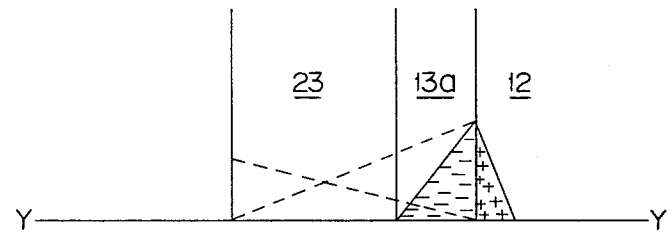
Figure 12:
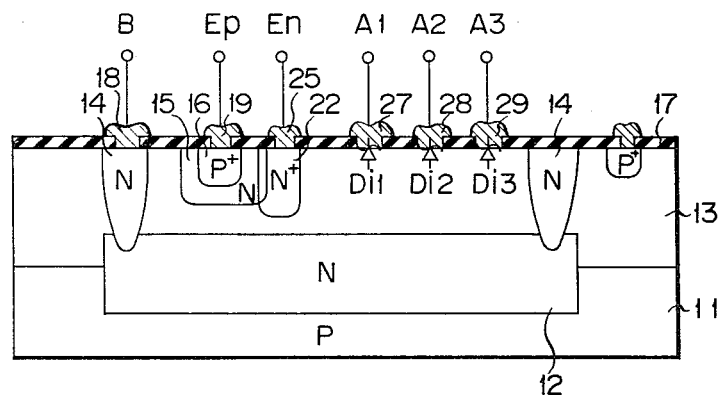
Figure 13:
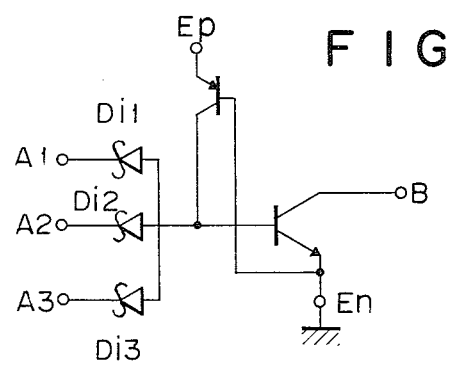
Figure 14:
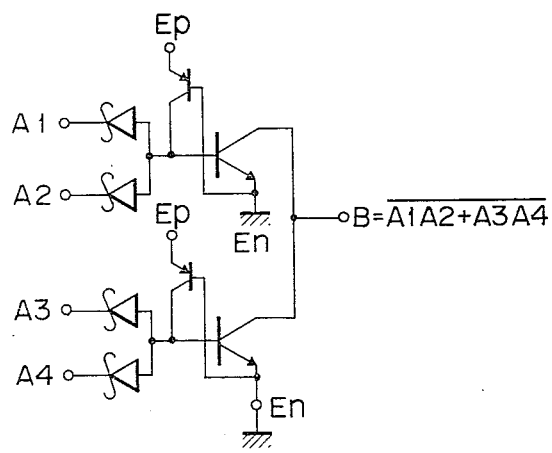
Figure 16:
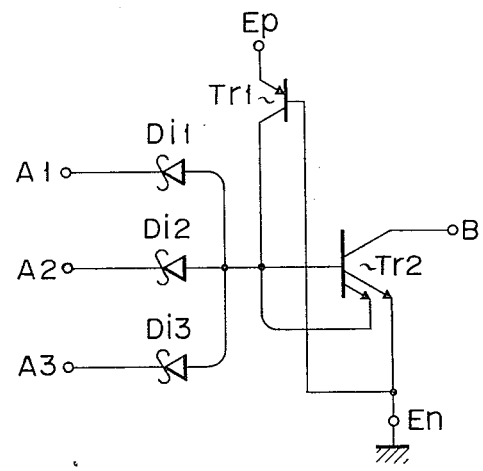
Figure 15:
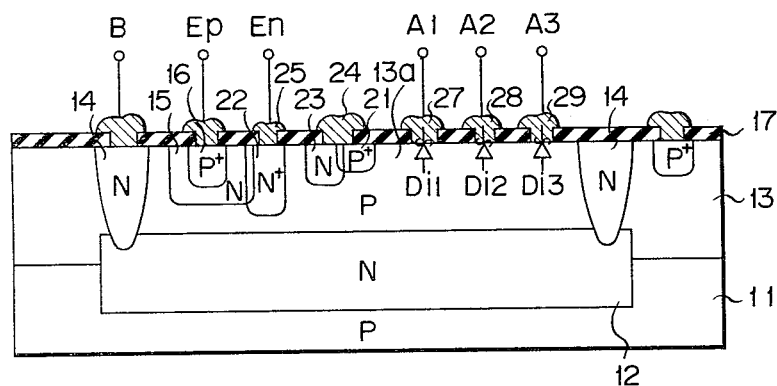
Figure 17:
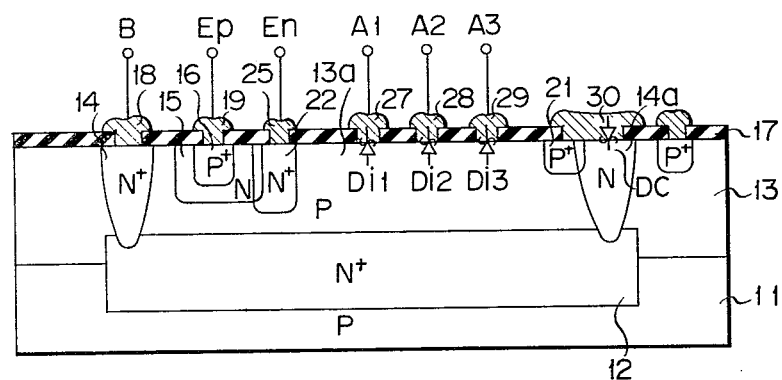
Figure 18:
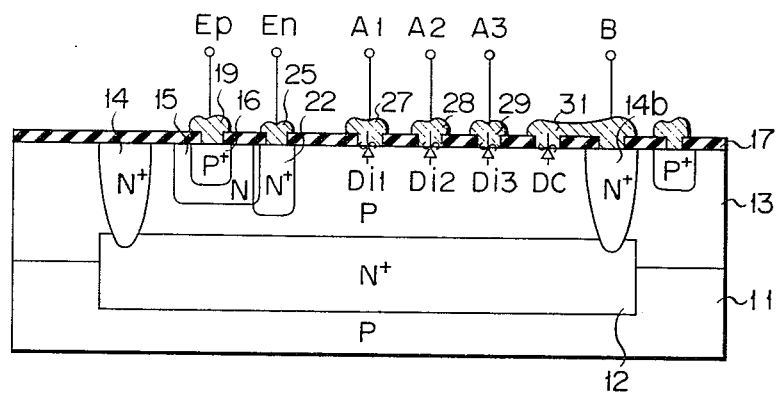
Figure 19:
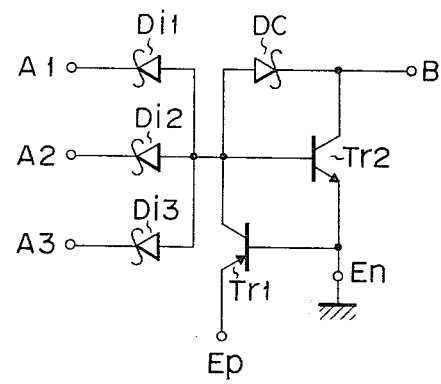
Figure 20:
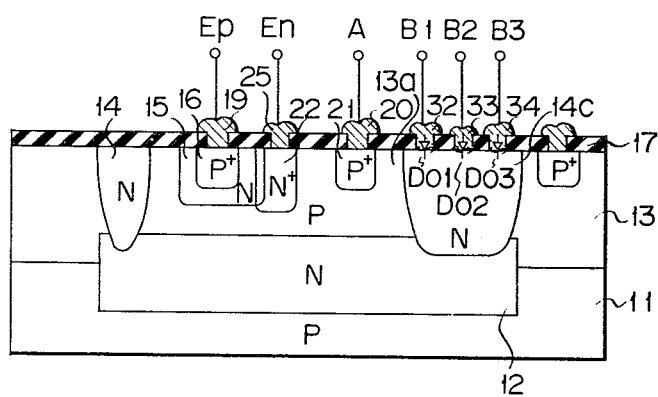
Figure 21:
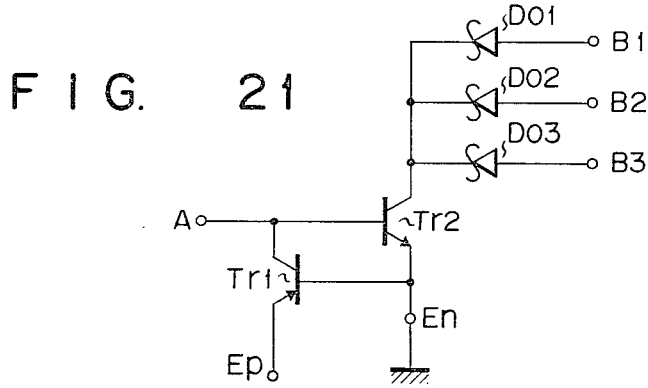
Figure 22:
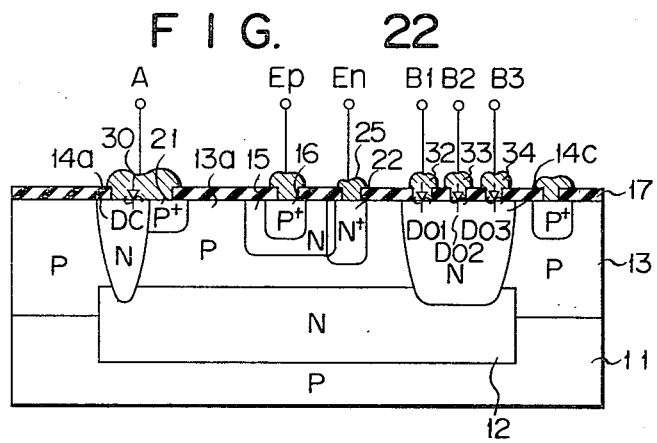
Figure 23:
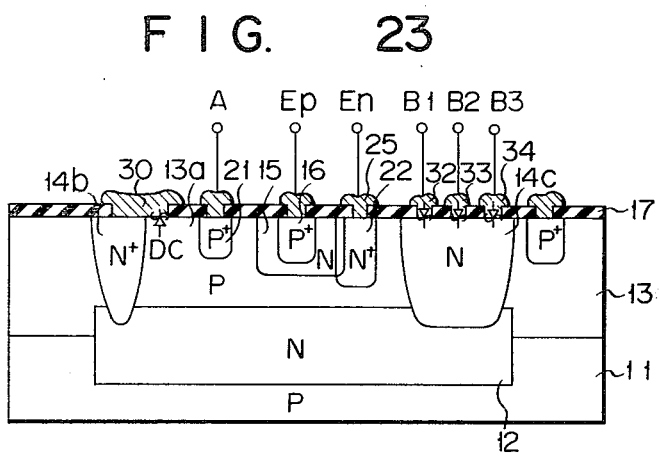
Figure 24:
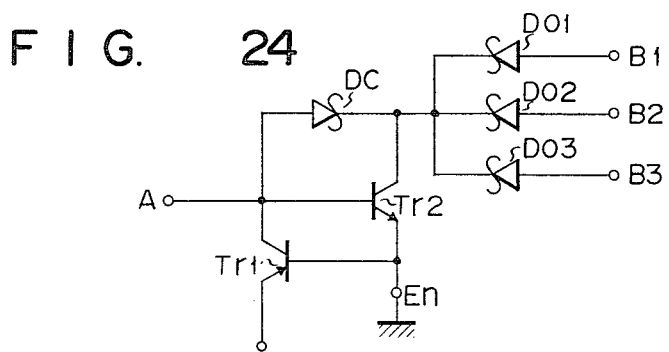
Figure 25:
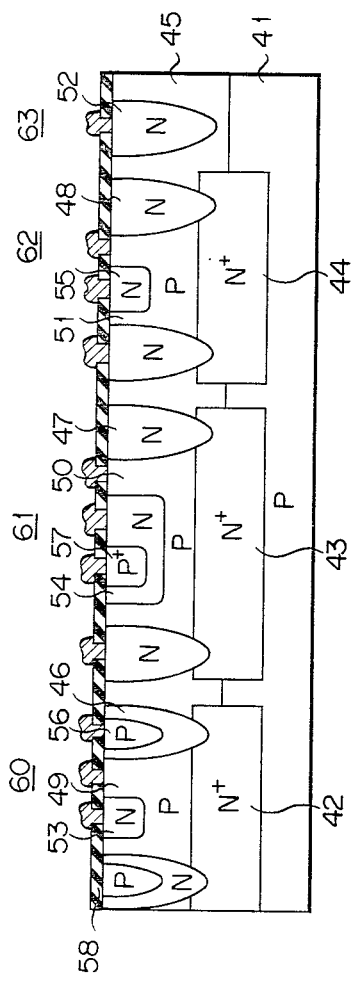
Figure 26:
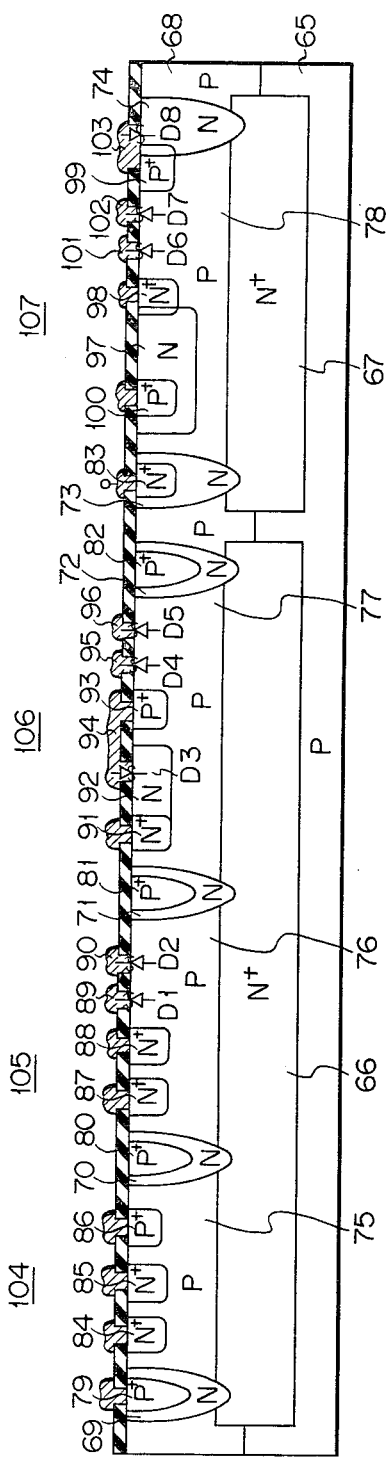

FIG. 3 schematically shows a logic circuit formed of the semiconductor device of FIGS. 1 and 2;

FIG. 4 is a profile of the impurity concentrations of the regions constituting the first vertical transistor of the semiconductor device embodying the invention;

FIG. 5 is a profile of the impurity concentrations of the regions constituting the second vertical transistor of the semiconductor device of the invention;

FIG. 6 is a cross sectional view of a semiconductor device according to another embodiment of the invention, wherein an N type region of high impurity concentration is formed in contact with another N type region formed in the isolated region by double diffusion;

FIG. 7 is a cross sectional view of the semiconductor device of FIG. 6 provided with an ohmic contact region;

FIG. 8 is a cross sectional view of a semiconductor device according to still another embodiment of the invention provided with a minority carrier-removing region;

FIG. 9 is a cross sectional view of the semiconductor device of FIG. 8 provided with an ohmic contact region;

FIG. 10 is an equivalent circuit corresponding to the semiconductor devices of FIGS. 8 and 9;

FIGS. 11A and 11B indicate the distribution of minority carriers in the semiconductor device of FIG. 8: FIG. 11A indicates the distribution of minority carriers in the lateral regions of the semiconductor device including the minority carrier-removing region, and FIG. 11B presents the distribution of minority carriers in the vertical regions of the semiconductor device;

FIG. 12 is a cross sectional view of a semiconductor device according to still another embodiment of the invention, wherein Schottky diodes are provided;

FIG. 13 is an equivalent circuit corresponding to the semiconductor device of FIG. 12;

FIG. 14 sets forth a logic circuit using the semiconductor device of FIG. 12;

FIG. 15 is a cross sectional view of the semiconductor device of FIG. 12 provided with a minority carrier-removing region;

FIG. 16 is an equivalent circuit corresponding to the semiconductor device of FIG. 15;

FIGS. 17 and 18 show cross sections of two modifications of semiconductor device provided with a clamping diode;

FIG. 19 is an equivalent cirucit corresponding to the semiconductor device of the semiconductor modifications of FIGS. 17 and 18;

FIG. 20 is a cross sectional view of the semiconductor device, wherein Schottky diodes are provided on the output side;

FIG. 21 is an equivalent circuit corresponding to the semiconductor device of FIG. 20;

FIGS. 22 and 23 are cross sectional views of two modifications of the semiconductor device provided with a clamping diode;

FIG. 24 is an equivalent circuit corresponding to the semiconductor device of FIGS. 22 and 23; and FIGS. 25 and 26 are cross sectional views of modifications of semiconductor device provided with various logic elements.

With the embodiment of FIG. 1, a semiconductor substrate 11 of one conductivity type, for example, P type has a region 12 of the opposite conductivity type, for example, N type buried in part of the semiconductor substrate 11. A P type epitaxial layer 13 is formed on the semiconductor substrate 11 as well as the buried region 12. The epitaxial layer 13 and semiconductor substrate 11 are assumed jointly to constitute a P type semiconductor substrate. An N type isolating region 14 extending from the surface of the epitaxial layer 13 to the N type buried region provides in the P type epitaxial layer 13 a P type isolated region 13a in association with the buried region 12. A first N type region 15 is diffused in the P type isolated region 13a from the surface thereof so as not to contact the buried region 12 as well as the isolating region 14. A second P type region 16 is diffused in the first N type region 15 from the surface thereof. An insulation layer 17 is mounted on a semiconductor structure (herein defined to mean an assembly of the semiconductor substrate 11 and above-mentioned layer and regions). Those portions of the insulation layer 17 which face part of the N type isolating region 14, part of the first N type region 15, part of the second P type region 16 and part of P type isolated region 13a are bored. An electrode metal, for example, an aluminium layer is evaporated on the surfaces of the above-mentioned regions 14, 15, 16, 13a which are exposed in the apertures thus formed, providing electrodes 18, 25, 19, 20.

With the semiconductor device constructed as described above, the second P type region 16, first N type region 15 and P type isolated region 13a respectively constitute the emitter, base and collector of the first vertical PNP transistor Tr1. The first N type region 15, P type isolated region 13a and N type buried region 12 respectively constitute the emitter, base and collector of the second vertical NPN transistor Tr2. The two first and second vertical transistors Tr1, Tr2 collectively form a logic element. Where two or more logic elements are formed on the same semiconductor substrate 11, then the buried region 12 and isolating region 14 should be so formed as to fully surround the base region or P type isolated region 13a of the second vertical transistor Tr2 for the complete electrical shut off of the second vertical transistor of one logic element from that of another. Where a back bias voltage is impressed across the semiconductor substrate 11 and epitaxial layer 13 with the isolated region 13a thus fully surrounded, then the second vertical NPN transistor Tr2 of one logic element is electrically disengaged from that of another.

With the logic element of FIG. 1, the impurity concentration of the P type epitaxial layer 13 and P type isolated layer 13a may be freely chosen. Therefore, P type regions of high impurity concentration, or P+ type regions 20, 21 (FIG. 2) may be diffused in part of the P type epitaxial layer 13 and P type isolated layer 13a to form the ohmic contact regions of the layers 13, 13a.

Where, with the semiconductor logic element of the above-mentioned construction, the first N type region 15 is grounded by the known process, then the logic element constitutes the logic circuit of FIG. 3. There will now be described by reference to FIG. 3 the operation of the logic element of FIGS. 1 and 2. Where the terminal Ep of the logic circuit is impressed with positive voltage of 0.7 V under the condition in which the input terminal A of the logic element is opened, or supplied with proper higher positive voltage than the threshold voltage of the grounded emitter vertical NPN transistor, then the first vertical PNP transistor Tr1 is put into operation, causing holes injected from the emitter 16 into the base region 15 to travel through the base region 15 to the collector region 13a concurrently acting as the base region of the second vertical transistor Tr2. Where excess holes are taken into the base region 13a of the second vertical transistor Tr2, then electrons are conducted from the emitter region 15 to the base region 13a of the second vertical transistor Tr2. Namely, the emitter-base junction of the second vertical transistor Tr2 is biased in the forward direction to render the transistor Tr2 conductive. As the result, the output terminal B of the logic circuit has a substantially zero potential. Where, at this time, the input terminal A has a zero potential, then the second vertical transistor Tr2 is brought to a shut off state, and the output terminal B has a positive potential. Namely, the logic element of FIG. 3 constitutes an inverter circuit which produces an output of "1" logic level, when supplied with an input of "0" logic level.

With the logic element of FIG. 3, the base width of the first vertical transistor used as a current source can be made extremely narrow by controlling the diffusion depth. As seen from FIG. 4, showing a profile of impurity concentrations, an acceleration electric field is applied to the minority carriers received in the semiconductor substrate, prominently elevating the efficiency of injecting and transporting the minority carrier. Further, the collector region fully surrounds to emitter region, noticeably increasing the efficiency with which the minority carriers are gathered in the collector of the vertical transistor. Therefore, a current amplification factor is improved over a broad range of amperage, enabling a logic element to consume far less power.

With the above-mentioned embodiment, the second vertical transistor Tr2 is used as an inverter element under the condition in which a transistor is operated in the forward direction with the first N type region 15 used as an emitter electrode and also in which one logic element is electrically shut off from another, thereby providing a high current amplification factor over a broad range of amperage, and in consequence a very large gain-bandwidth product $f_T$. Where the second vertical transistor Tr2 is operated in the backward direction with the buried region 12 and isolating region 14 used as an emitter, then the second vertical transistor Tr2 can have a proper current amplification factor. In this case, the impurity concentration of the collector region of the second vertical transistor which is formed of the buried region 12 and isolating region 14 is higher than in the base region 13a, as apparent from the impurity concentration profile of FIG. 5. Further, the base region of the second vertical transistor is formed of the separated region 13a whose impurity concentration remains constant. Therefore, a deceleration electric field is prevented from being applied to the minority carrier, prominently improving the efficiency of supplying the minority carriers from the collector to the base. Where the impurity concentration of the buried region 12, first N type region 15 and the base region 13a is properly chosen and the base width is controlled to a desired level, then the current amplification factor of the second vertical transistor, when operated in the backward direction, can be freely defined. As the result, it is possible fully to suppress current hogging which has hitherto raised problems with the direct coupled transistor logic (DCTL), thereby attaining the reliable operation of a logic circuit.

With a semiconductor device of FIGS. 6 and 7 according to another embodiment of this invention, an N type region of high impurity concentration, that is, a third N+ type region 22 is formed in the P type isolated region 13a so as to partly overlap the first N type region 15 of the logic element of FIGS. 1 and 2. With the logic element of the above-mentioned arrangement, the first vertical PNP transistor Tr1 has the emitter formed of the second P+ type region 16, the base region formed of the first N type region 15 and the collector region formed of the P type isolated region 13a. On the other hand, the second vertical NPN transistor Tr2 has the emitter formed of the first N type region 15 and third N+ type region 22, the base region formed of the P type isolated region 13a and the collector formed of the N type buried region 12.

Provision of the third N+ type region 22 enables the minority carriers to be injected into the emitter of the second vertical region with a higher efficiency, attaining the higher current amplification factor of the second vertical NPN transistor.

With the third embodiment of FIG. 8, a fourth N type region 23 is formed in the P type isolated region 13a defined by the N type buried region 12 and N type isolating region 14 to be uncontacted with the buried region 12, isolating region 14 and the third N+ region 22 partly over lapping the first N type region 15 (in which the second P type region 16 is provided) also provided in the P type isolated region 13a. An aperture is bored in the insulation layer 17 so as to extend over both fourth N type region 23 and P type isolated region 13a. An aluminium layer, for example, is evaporated through the aperture over both fourth N type region 23 and P type isolated region 13a to provide an electrode 24. An aperture is also formed in those portions of the insulation layer 17 which face the N type isolating region 14, second P+ type region 16 and first N type region 15. An aluminium layer, for example, is evaporated through the apertures on the above-mentioned regions 14, 16,15 to provide electrodes 18, 19, 25 respectively. With the logic element constructed as described above, an ohmic constant region 21a (FIG. 9) is formed in the P type isolated region 13a so as to partly overlap the fourth N type region 23 in order to assure an ohmic contact for the P type isolated region 13a.

The logic elements of FIGS. 8 and 9 respectively comprise the first vertical PNP transistor whose emitter is formed of the second P type region 16, whose base is formed of the first N type region 15 and third N+ type region 22, and whose collector is formed of the P type isolated region 13a surrounding both regions 16, 15; and the forward-acting second vertical NPN transistor whose emitter is formed of the first grounded N type region 15 and N+ type region 22, whose base is formed of the P type isolated region 13a having a fixed impurity concentration, whose collector is formed of the N type buried region 12 and N type isolating region 14 and whose minority carrier-removing region is formed of the fourth N type region 23 connected to the P type isolated region 13a.

The logic elements of FIGS. 8 and 9 respectively have an equivalent circuit arrangement shown in FIG. 10. The current source terminal Ep of the logic element is connected to the emitter of the first vertical PNP transistor Tr1. The input terminal A is connected to the collector of the first vertical PNP transistor Tr1 concurrently acting as the base region 13a of the second vertical NPN transistor Tr2 and also to the N type minority carrier-removing region 23. The output terminal B is connected to the collector of the second vertical NPN transistor Tr2. The ground terminal En is connected to the base of the first vertical PNP transistor Tr1 and the emitter of the second vertical NPN transistor Tr2 (that is, the first N type region 15 concurrently acting as both base and emitter).

The logic elements of FIGS. 8 and 9 which are operated in the same manner as those of the preceding embodiments are advantageous in that provision of the minority carrier-removing region 23 prominently elevates the speed at which the logic level of an output from the logic element is inverted from "0" to "1" or vice versa.

There will now be described the operation of the minority carrier-removing region 23. FIGS. 11A and 11B show the distribution of minority carriers in the regions arranged in the directions of X—X and Y—Y of the logic element of FIG. 8. Referring to FIG. 11A, the regions 15 and 22 acting as an emitter of the second vertical NPN transistor Tr2 is stored with minority carriers or holes transferred from the emitter region 16 of the first vertical PNP transistor Tr1 and the base region 13a of the second vertical NPN transistor Tr2. The base region 13a of the second vertical NPN transistor Tr2 is stored with minority carriers or electrons delivered from the collector region 12 and regions 15 and 22 acting as emitter of the second vertical NPN transistor Tr2. The fourth N type region connected to the base region 13a of the second vertical NPN transistor Tr2, that is, the minority carrier-removing region 23 is free from minority carrier. An area defined by broken lines in FIG. 11A denotes the distribution of minority carriers in the respective regions of the logic element, where the minority carrier-removing region 23 is not provided.

Referring to FIG. 11B, the base region 13a of the second vertical NPN transistor Tr2 is stored with minority carriers or electrons sent forth from the regions 15 and 22 acting as the emitter and collector region 12. The minority carrier-removing region 23 connected to the base region 13a is free from minority carrier. However, the collector 12 is stored with minority carriers or holes injected from the base region 13a. As in FIG. 11A, an area defined by broken lines in FIG. 11B shows the distribution of minority carriers, where the minority carrier-removing region 23 is not provided. Provision of the minority carrier-removing region 23 connected to the base region 13a prevents minority carriers from being excessively stored in a logic element, enabling the logic level of an output from the logic element to be more quickly inverted from "0" to "1". The N type minority carrier-removing region 23 may be distributed in the base region 13a as broadly as permitted.

There will now be described a semiconductor device according to still another embodiment of this invention shown in FIG. 12. A P type epitaxial layer 13 is formed by vapor epitaxial growth on the surface of the P type semiconductor substrate 11 and the N type region 12 buried therein. In the P type isolated region 13a marked off by the N type separating region 14 in the P type epitaxial layer 13 are provided the first N type region 15 (in which the second P type region 16 is formed) and the third N+ type region 22 partly overlapping the region 15 separate from the buried region 12 and the isolating region 14, and a plurality of, for example, three Schottky diodes Di1, Di2, Di3. These Schottky diodes Di1, Di2, Di3 are formed at three junctions between the isolated region 13a and metal layers 27, 28, 29 respectively, which are evaporated on the surface of the P type isolating region 13a through a plurality of holes formed in that portion of the insulation layer 17 which faces the P type isolated region 13a. Further, electrodes 18, 19, 25 are formed on the N type isolating region 14, second P type region 16 and third N+ type region 22 respectively through the apertures bored in those portions of the insulation layer 17 which face the regions 14, 16, 22.

The semiconductor device of FIG. 12 comprises a first vertical PNP transistor Tr1 whose emitter is formed of the second P type region 16, whose base is formed of the first N type region 15 and the third N+ type region 22 and whose collector is formed of the P type isolated region 13a, and a second vertical NPN transistor Tr2 whose emitter is formed of the first N type region 15 and third N+ type region 22, whose base is formed of the P type isolated region 13a, and whose collector is formed of the N type buried region 12 and the isolating region 14. The above-mentioned Schottky diodes Di1, Di2, Di3 jointly constitute an AND gate circuit.

For a logic element constructed as shown in FIG. 12, it is particularly important to cause the Schottky diode to have a lower level of forward voltage than that of the emitter-base junction of the second vertical NPN transistor Tr2. FIG. 13 shows an equivalent logic circuit of the logic element of FIG. 12. The input terminals A1, A2, A3 are connected to the collector of the first vertical PNP transistor Tr1 and the base of the second vertical NPN transistor Tr2. The output terminal B of the logic element is connected to the collector of the second vertical NPN transistor Tr2. The ground terminal En is connected to the base of the first vertical PNP transistor Tr1 and the emitter of the second vertical NPN transistor Tr2.

Where the power supply terminal Ep is impressed with positive voltage of 0.8 V under the condition in which all the input terminals A1, A2, A3 are opened or impressed with proper higher positive voltage than the threshold voltage of the second grounded emitter vertical NPN transistor Tr2, then the second vertical NPN transistor Tr2 of the logic element is put into operation, causing an output of "0" logic level to be produced at the output terminal B. Where at least one of the input terminals A1, A2, A3 has a zero potential, namely, a grounding potential, then the second vertical NPN transistor Tr2 is electrically shut off, causing an output of "1" logic level to be produced at the output terminal B. The logic element of FIG. 12 displays the NAND function including the AND function provided by the plural Schottky diodes Di1, Di2, Di3 and the inverter function offered by the second vertical NPN transistor Tr2. FIG. 14 shows a logic circuit consisting of a plurality of logic elements of FIG. 12 capable of presenting the AND and inverter functions.

With a semiconductor device of FIG. 15 according to still another embodiment of this invention, a logic element whose input gates are formed of Schottky diodes Di1, Di2, Di3 is provided with a minority carrier-removing region 23. The embodiment of FIG. 15 results from the addition of a minority carrier-removing region 23 partly overlapping a P+ type ohmic contact region 21 to the logic element of FIG. 12. The ohmic contact region 21 and the minority carrier-removing region 23 are connected together by a metal electrode 24. FIG. 16 shows an equivalent circuit of the above-mentioned logic circuit comprising the Schottky diodes Di1, Di2, Di3 and minority carrier-removing region 23. The logic element according to the embodiment of FIG. 15 is operated fundamentally in the same manner as that of FIG. 12, description thereof being omitted. The logic element of FIG. 15 provided with the minority carrier-removing region 23 enables the logic level of an output to be inverted from "0" to "1" or vice versa faster than the logic element of FIG. 12 for the reason given in connection with the embodiments of FIGS. 8 and 9.

There will now be described by reference to FIG. 17 a semiconductor device according to a further embodiment of this invention. The logic element of FIG. 17 is constructed and operated fundamentally in the same manner as the logic element of FIG. 12, description of the same parts being omitted. With the logic element of FIG. 17, part 14a of an N type isolating region 14 marking off a P type isolated region 13a has a low impurity concentration.

A metal layer 30 is deposited on the surface of the region 14a of low impurity concentration. A Schottky diode Dc is provided at the junction of the metal layer 30 and the region 14a. The metal layer is disposed adjacent to the region 14a and extends to the surface of the P+ type ohmic contact region 21 formed in the P type isolated region 13a. The Schottky diode Dc is connected to the P type isolated region 13a through the ohmic contact region 21.

FIG. 19 shows an equivalent circuit of the logic element of FIG. 17. The Schottky diode Dc may be formed as shown in FIG. 18. Namely, an insulation layer 17 is formed on the surface of the P type isolated region 13a. That portion of the insulation layer 17 which is disposed near an N+ type isolating region 14b of high impurity concentration is bored with an aperture. A metal layer 31 is deposited through the aperture. The Schottky diode Dc is formed at the junction of the metal layer 31 and P type isolated region 13a. The Schottky diode Dc is connected to the collector of the second vertical NPN transistor Tr2 comprising the N type isolating region 14 and N type buried region 12 by the metal layer 31 extending to the surface of the N+ type isolating region 14b through the aperture bored in the insulation layer 17 near the N+ type isolating region 14b. The metal layer 31 is connected to the output terminal B as an output electrode. The Schottky diode Dc which is referred to as a clamping diode can decrease an density of minority carriers stored in the collector and base of the second vertical NPN transistor Tr2 and accelerate the operation of a logic element. For the embodiments of FIGS. 17 and 18 provided with the input Schottky diode Di and clamping Schottky diode Dc, it is important that these Schottky diodes Di, Dc be so formed as to cause a logic voltage swing to indicate a value arrived at by subtracting the forward voltage Vi of the input Schottky diode Di from the forward voltage Vc of the clamping Schottky diode Dc, about 200 mV. To meet the above-mentioned requirement, it is advised that where, in the case of the embodiment of FIG. 17, the junctions of the metal layers 27, 28, 29 with the P type isolated region 13a and the junction of the metal layer 30 with the N type isolating region 14a are all assumed to have the same area, then the metal layer used to provide the clamping Schottky diode Dc be formed of platinum and the metal layers 27, 28, 29 used to provide the input Schottky diodes Di1, Di2, Di3 be prepared from titanium. With the embodiment of FIG. 18, it is advised that the metal layer 31 forming the clamping Schottky diode Dc and the metal layers 27, 28, 29 providing the input Schottky diodes Di1, Di2, Di3 all be made of titanium and that the junction of the metal layer 31 providing the clamping Schottky diode Dc with the P type isolated region 13a be designed to have a smaller area than each of the junctions of the metal layers 27, 28, 29 with said P type isolated region 13a.

There will now be described by reference to FIG. 20 a semiconductor device according to a further embodiment of this invention. The P type isolated region 13a marked off by the N type isolating region 14 in the P type epitaxial layer 13 deposited on the P type semiconductor substrate 11 and N type buried region 12 comprises, as in the preceding embodiments, the first N type region 15 in which the second P type region 16, the third N+ type region 22 overlapping the region 15 and the P+ type ohmic contact region are provided. With the embodiment of FIG. 20, a portion 14c of the N type isolating region 14 is provided with a plurality of (for example, three) Schottky diodes Do1, Do2, Do3. These Schottky diodes Do1, Do2, Do3 are formed at the junctions of the region 14c and metal layers 32, 33, 34 evaporated thereon through the apertures bored in that portion of the insulation layer 17 which faces the region 14c. Electrodes 19, 25, 20 are formed on the regions 16, 22, 21 through the apertures bored in the insulation layer 17. FIG. 21 is an equivalent circuit of the logic element of FIG. 20. Where the current supply terminal Ep is impressed with positive voltage of 0.7 V, and the input terminal A is supplied with a signal of "1" logic level, then the first vertical PNP transistor Tr1 and in consequence the second vertical NPN transistor Tr2 are rendered conductive, causing a signal of "0" logic level to be produced at the output terminals B1, B2, B3. Where the input terminal A is supplied with a signal of "0" logic level, then the second vertical NPN transistor Tr2 becomes nonconductive, causing a signal of "1" logic level to be sent forth from the output terminals B1, B2, B3.

FIGS. 22, 23 are modifications of the logic element of FIG. 20 which are provided with clamping diodes to accelerate the speed at the logic level of an output from the logic element provided with a plurality of output Schottky diodes B1, B2, B3 are inverted from "0" to "1" or vice versa. With the logic element of FIG. 22, the clamping diode Dc is a Schottky diode which is formed at the junction of the N type isolating region 14a of low impurity concentration and the metal layer 30 evaporated on the region 14a so as to extend to the P+ type ohmic contact region 21 and which is also connected to the base of the second vertical NPN transistor Tr2 concurrently acting as the collector of the first vertical PNP transistor Tr1.

With the logic element according to the embodiment of FIG. 23, the clamping diode is a Schottky diode which is formed at a junction between the metal layer 30 evaporated on the surface of part of the P type isolated region 13a disposed adjacent to the N+ type isolating region 14b so as to extend to the N+ type isolating region 14b and part of the P type isolated region 13a, and which is also connected by the metal layer 30 to the N type isolating region 14b and N type buried region 12 jointly constituting the collector of the second vertical NPN transistor Tr2. FIG. 24 is an equivalent circuit of the logic elements of FIGS. 22 and 23.

For the embodiments of FIGS. 22, 23 provided with the clamping Schottky diode Dc and output Schottky diode Do, it is important that both clamping and output Schottky diodes Dc, Do be so formed as to cause the forward voltage Vc of the clamping Schottky diode Dc to be higher than the forward voltage Vo of the output Schottky diode Do and also the logic voltage swing Vc-Vo to indicate about 200 mV. To meet the above-mentioned requirement, it is advised that where, in the case of the embodiment of FIG. 22, the junctions of metal layers 30, 32, 33, 34 forming the Schottky diodes with the semiconductor region are assumed to have the same area, then the metal layer 30 providing the clamping Schottky diode Dc be prepared from platinum and the metal layers 32, 33, 34 constituting output Schottky diodes Do1, Do2, Do3 be made of titanium or molybdenum. Where all the metal layers are made of the same material, for example, platinum, then it is preferred that the metal layer 30 be deposited on the semiconductor region 14a and the metal layers 32, 33, 34 be provided on the semiconductor region 14c so as to cause the junction of the clamping Schottky diode Dc with the semiconductor region to have a smaller area than each of the junctions of the Schottky diodes Do1, Do2, Do3 with the semiconductor region.

With the embodiment of FIG. 23, it is advised that where all the metal layers are made of the same material, for example, titanium, then it is advised that the metal layer 30 be provided on the semiconductor region 13a and the metal layers 32, 33, 34 be deposited on the semiconductor region 14c so as to cause the junction of the clamping Schottky diode Dc with the semiconductor region to have a smaller area than each of the junctions of the output Schottky diodes Do1, Do2, Do3 with the semiconductor region.

The foregoing description refers to the semiconductor device in which one type of logic element is formed on the same semiconductor substrate. The following embodiment relates to a semiconductor device in which various kinds of logic elements, transistor elements and resistor elements are formed on the same semiconductor substrate.

There will now be described a semiconductor device of FIG. 25 according to a still further embodiment of this invention. A plurality of N type buried regions 42, 43, 44 are formed on a P type semiconductor substrate 41 containing, for example, boron at the rate of about $10^{14}$ to $10^{16}$ atoms/cm$^3$. These N type buried region may each be prepared by diffusing a donor impurity such as arsenic, antimony or phosphorus in the P type semiconductor substrate 41 at a surface concentration of about $10^{18}$ to $10^{20}$ atoms/cm$^3$. A P type epitaxial layer 45 containing boron is formed by vapor epitaxial growth to a thickness of about 2 to 5 microns with the concentration of the boron chosen to be smaller (for example $10^{15}$ to $10^{17}$ atoms/cm$^3$) than the impurity concentration of the above-mentioned buried regions 42, 43, 44 on the P type semiconductor substrate 41 provided with the buried regions 42, 43, 44. In the embodiment of FIG. 25, a semiconductor substrate structure is supposed to be formed of the semiconductor substrate 41 and the epitaxial layer 45. A plurality of N type isolating regions 46, 47, 48 having an impurity concentration of $10^{16}$ to $10^{17}$ atoms/cm$^3$ are formed in the epitaxial layer 45 so as to reach the buried regions 42, 43, 44 respectively. The N type isolating regions 46, 47, 48 mark off P type isolated regions 49, 50, 51 respectively in the P type epitaxial layer 45. When the N type isolating regions 46, 47, 48 are formed, it is possible to be formed a resistor region 52 in the epitaxial layer 45. N type regions 53, 54, 55 are formed in the P type isolated regions 49, 50, 51 respectively by thermally diffusing phosphorus as an impurity at a high concentration from the surrounding N type isolating regions 46, 47, 48. In this time, the N type regions 53, 54, 55 are formed so as not to contact the N type isolating regions 46, 47, 48 and the buried regions 42, 43, 44. Further, boron is thermally diffused in the N type isolating region 46 and N type diffusion region 54 to provide P+ type diffusion regions 56, 57 having a larger impurity concentration (for example, $10^{18}$ to $10^{19}$ atoms/cm$^3$) than that of the N type diffusion regions 53, 54, 55. At the diffusion of the P+ type regions 56, 57, it is possible to form ohmic contact regions (not shown) of high impurity concentration for the P type isolated regions 49, 50, 51.

An insulation layer 58 is mounted on the surface of a semiconductor structure built as described above. Electrodes are deposited through the apertures bored at the prescribed spots of the insulation layer 58. With the semiconductor device of FIG. 25, a first logic element 60 comprises a lateral PNP transistor LTr whose emitter is formed of the P+ type region 56, whose base is formed of the N type isolating region 46 and whose collector is formed of the P type isolated region 49, and a vertical NPN transistor VTr whose emitter is formed of the N+ type buried region 42, whose base is formed of the P type isolated region 49 and whose collector is formed of the N type region 53. A second logic element 61 comprises a first vertical PNP transistor Tr1 whose emitter is formed of the P+ type region 57, whose base is formed of the N type region 54 and whose collector is formed of the P type isolated region 50 and a second vertical NPN transistor Tr2 whose emitter is formed of the N type region 54, whose base is formed of the P type isolated region 50 and whose collector is formed of the N+ type buried region 43. A third logic element 62 comprises a vertical NPN transistor whose emitter is formed of the N type region 55, whose base is formed of the P type isolating region 51 and whose collector is formed of the N type buried region 44. A resistor element 63 is formed of a resistor region 52.

The lateral PNP transistor LTr of the first logic element 60 is used as a current source or load, and the vertical NPN transistor VTr thereof is operated as an inverter element. The vertical NPN transistor VTr acting as an inverter element is actuated in the backward direction and presents difficulties in providing a large gain-bandwidth product $f_T$. Therefore, the first logic element 60 containing the inverter transistor VTr is operated effectively only at low frequency, but offers the advantage of prominently facilitating high density integration. With the second logic element 61, the second vertical NPN transistor Tr2 used as an inverter element acts in the forward direction, attaining a high current amplification factor over a broad range of amperage and a large gain-bandwidth product $f_T$. Therefore, the second logic element 61 provided with the vertical inverter transistor Tr2 is effectively operated at high frequency.

A combination of the first and second logic elements 60, 61 enables the resultant logic circuit device to be operated over a broad range of frequency, because the second logic elements compensates for the difficulties presented by the first logic element in high frequency operation. The second logic element 61 cannot be directly connected to external digital and linear circuits such as a transistor transistor logic (TTL) circuit and emitter coupled logic (ECL) circuit. However, coupling of the vertical NPN transistor element 62 acting as an interface circuit element to the second logic element 61 enables this logic element 61 to be connected to any of the above-mentioned external circuits. This invention is very useful to cause the digital circuit element and linear circuit element included in the digital analog circuit device which are operative up to a high frequency level to be formed of the above-mentioned second logic element 61 and vertical NPN transistor element 62 and be incorporated in the same chip.

The first logic element 60 can neither be directly connected to the digital circuit or linear circuit such as TTL or ECL circuit. Coupling of the vertical NPN transistor element 62 acting as an interface circuit element to the first logic element 60, therefore, enables the first logic element 60 to be connected to any of the aforesaid external circuits. Combination of the first and second logic elements 60, 61 and vertical NPN transistor to provide a prescribed logic circuit can produce a semiconductor device which admits of high density integration, is operative up to a high frequency level and can be connected to any of the above-mentioned external circuits.

With the embodiment of FIG. 26, a P type epitaxial layer 68 is formed on a P type semiconductor substrate 65 including N+ type buried regions 66, 67. N type isolating regions 69, 70, 71, 72 are formed on those portions of the epitaxial layer 68 which face the N+ type buried region 66 so as to reach the buried region 66. Similarly, N type isolating region 73, 74 are formed on those portions of the epitaxial layer 68 which face the N+ type buried region 67 so as to reach the buried region 67. As the result, a plurality of P type isolated regions 75, 76, 77, 78 are formed in the epitaxial layer 68. P+ type diffusion regions 79, 80, 81, 82 are formed in the N type isolating regions 69, 70, 71, 72 respectively. An N+ type diffusion region 83 is formed in the N type isolating region 73. Further formed in the P type isolating region 75 are first and second N+ type regions 84, 85 and third P+ type region 86. Formed in the P type isolated region 76 are fourth and fifth N+ type regions 87, 88. Evaporated on the surface of the P type isolated region 76 are metal layers 89, 90 to provide Schottky diodes D1, D2. Formed in the P type isolated region 77 are a sixth N+ type region 91, seventh N type region 92 adjacent to the sixth region 91, and eighth P+ type region 93. A metal layer 94 is evaporated on the surface of the seventh region 92 to provide a Schottky diode D3. The metal layer 94 is partly spread over the insulation layer 17 up to the surface of the eighth $P^{30}$ type region 93. The Schottky diode D3 formed in the seventh region 92 is connected to the isolated region 77 through the eighth region 93. Metal layers 95, 96 are evaporated on the surface of the isolated region 77 to provide Schottky diodes D4, D5. Ninth N type region 97, tenth N+ type region 98 partly overlapping the ninth region 97, and eleventh P+ type region 99 partly overlapping the N type isolating region 74 are formed in the P type isolated region 78 surrounded by the isolating regions 73, 74. A twelfth $P^{30}$ type region 100 is formed in the ninth N type region 97. Metal layers 101, 102 are evaporated on the surface of the P type isolated region 78 to provide Schottky diodes D6, D7. A metal layer 103 is evaporated on the surface of the N type isolating region 74 so as to extend to the surface of the eleventh P+ type region 99. A Schottky diode D8 is formed at the junction of the metal layer 103 and N type isolating region 74. The Schottky diode D8 is connected to the P type isolated region 78 through the eleventh P+ type region 99.

An insulation layer 17 is mounted on the above-mentioned semiconductor structure. Electrode-leading metal layers are formed on the surface of the prescribed portions of the semiconductor structure through the apertures bored at the desired spots of the insulation layer 17. The metal layers 89, 90, 94, 95, 96, 101, 102, 103 formed to provide Schottky diodes concurrently act as electrodes.

With a semiconductor device comprising a plurality of logic elements constructed as shown in FIG. 26, the first logic element 104 constitutes a self-aligned Super injection logic (S²L) element disclosed in U.S. Patent Application, Ser. No. 644,293 filed Dec. 24, 1975 now U.S. Pat. No. 4,054,900, and is adapted for operation over a range from DC to 25 MHz. The second logic element 105 forms an S²L element provided with the Schottky diodes D1, D2, and is effectively operated over a frequency range of 25 to 50 MHz. The third logic element 106 is provided with the Schottky diode D3 acting as a clamping diode and input Schottky diodes D4, D5 and is operative over a frequency range of 50 to 100 MHz. The fourth logic element 107 comprises the input Schottky diodes D6, D7 and clamping diode D8 and first and second vertical transistors, and attains a high frequency operation over a range of 100 to 500 MHz. A combination of the first to the fourth logic elements 104 to 107 offers a logic circuit device applicable over a broad frequency range.

As apparent from the description of the preceding embodiments, this invention provides a logic element which displays a high current amplification factor over a broader range of amperage, attains smaller power consumption and faster and more excellent operation at high frequency than has been possible with the prior art logic element, thereby offering a logic circuit device capable of being operated over a broad frequency range by combining a plurality of the above-mentioned logic elements with various types of other logic elements adapted for low frequency operation.

With the foregoing embodiments, a P type semiconductor substrate was used, and the conductivity type of various regions was determined on the basis of the P type of the semiconductor substrate. However, this invention is also applicable to a semiconductor device using an N type semiconductor substrate, in which the conductivity type of various regions is reversed from the preceding case. Further, the P type semiconductor structure of the foregoing embodiments comprised a P type semiconductor substrate and an epitaxial layer formed thereon. However, the semiconductor structure may be formed of a semiconductor substrate provided with an N type buried region or regions.

What we claim is:

1. An integrated injector logic semiconductor device having at least one input terminal and at least one output terminal, which comprises a semiconductor substrate of one conductivity type; at least one region buried in the semiconductor substrate with the opposite conductivity type thereto; an isolating region formed in the semiconductor substrate with the opposite conductivity type thereto and extending from said surface of the semiconductor substrate into said buried region to form at least one isolated region with the same conductivity type as the semiconductor substrate, said isolating region and isolated region being connected to said output terminal and input terminal respectively; a first region formed in the isolated region with the opposite conductivity type to the semiconductor substrate to be uncontacted with the buried region and isolating region, said first region including a main region and an auxiliary region in contact with said main region and at a higher impurity concentration than said main region; and a second region formed in the main region of said first region with the same conductivity type as the semiconductor substrate, whereby a first vertical transistor of one polarity is constituted by said second region, said first region and said isolated region acting as emitter, base and collector, respectively, said emitter and base being forwardly biased and a second vertical transistor of opposite polarity is constituted by said first region, said isolated region and said buried region acting as emitter, base and collector respectively.

2. A semiconductor device according to claim 1, wherein an ohmic contact region is formed in the isolated region and the isolated region is connected to said input terminal through said ohmic region.

3. A semiconductor device according to claim 1, wherein at least one metal layer is formed on the isolated region marked off by the isolating region to form at least one Schottky diode at the junction of the metal layer and isolated region, said metal layer being connected to said input terminal.

4. A semiconductor device according to claim 1 having a plurality of input terminals, wherein a plurality of metal layers connected to said input terminals are formed on the isolated region marked off by the isolating region to provide an AND gate circuit comprising a plurality of Schottky diodes formed at the junctions of the metal layers and the isolated region.

5. A semiconductor device according to claim 1, wherein at least one first metal layer is formed on the surface of the isolated region marked off by the isolating region to form at least one first Schottky diode at the first junction of the first metal layer and isolated region, and a second metal layer is formed on the surface of the isolating region to provide a second Schottky diode at the second junction of the second metal layer and isolating region, said first metal layer being connected to the input terminal and said second layer being connected to the isolated region whereby the second Schottky diode acts as a clamping diode for the second transistor.

6. A semiconductor device according to claim 1 having a plurality of input terminals wherein a plurality of first metal layers are formed on the surface of the isolated region marked off by the isolating region to form a first Schottky diode at the first junction of each of the first metal layers and isolated region and a second metal layer is formed on the surface of the isolating region to provide a second Schottky diode at the second junction of the second metal layer and isolating region, said first metal layers being connected to the input terminals respectively, and said second metal layer being connected to the isolated region whereby the second Schottky diode acts as a clamping diode for the second transistor.

7. A semiconductor device according to claim 5 or 6 wherein said first and second junctions have the same area and said first metal layer is made of titanium while said second metal layer of platinum.

8. A semiconductor device according to claim 5 or 6 wherein an ohmic contact region is formed adjacent to the isolating region and the second metal layer is formed on both the isolating region and ohmic contact region.

* * * * *